United States Patent
Taniyama et al.

[11] Patent Number: 6,096,233
[45] Date of Patent: Aug. 1, 2000

[54] METHOD FOR WET ETCHING OF THIN FILM

[75] Inventors: Hiroki Taniyama, Tosu; Miyako Yamasaka, Yamanashi-ken; Hiroyuki Kudou, Kumamoto-ken; Akira Yonemizu, Kumamoto, all of Japan

[73] Assignee: Tokyo Electron Limited, Tokyo, Japan

[21] Appl. No.: 08/935,837

[22] Filed: Sep. 23, 1997

[30] Foreign Application Priority Data

Sep. 24, 1996 [JP] Japan ................................... 8-271291

[51] Int. Cl.⁷ ................................................. H01L 21/302
[52] U.S. Cl. .............................. 216/92; 438/5; 438/748; 438/756; 438/757
[58] Field of Search ....................... 216/92, 91; 438/748, 438/756, 757, 5, 14

[56] References Cited

U.S. PATENT DOCUMENTS

| | | | |
|---|---|---|---|
| 5,474,644 | 12/1995 | Kato | 156/345 |
| 5,665,200 | 9/1997 | Fujimoto | 438/694 |
| 5,914,275 | 6/1999 | Koderq | 438/693 |

*Primary Examiner*—Christopher Henderson
*Attorney, Agent, or Firm*—Oblon, Spivak, McClelland, Maier & Neustadt, P.C.

[57] ABSTRACT

The present invention provides a wet etching method applied to a thin, including the steps of (a) setting in advance an etching rate of said thin film in view of a kind of the thin film to be etched, components of said etchant solution, and temperature, (b) loading the substrate on a spin chuck such that the surface having the thin film formed thereon faces upward and, (c) detecting a thickness of the thin film in at least a peripheral portion and a central portion of the substrate. The method also includes the steps (d) calculating moving speeds of a nozzle at predetermined passing points of said nozzle on the basis of the etching rate set in step (a) and a film thickness detected in the step (c), (e) rotating the substrate by driving the spin chuck, and (f) controlling the moving speed of the nozzle, while allowing the nozzle to supply the etchant solution to the thin film formed on the surface of the substrate which is being rotated, to conform with the moving speeds calculated in step (d) at the predetermined passing points of the nozzle so as to move the nozzle in a radial direction of the substrate.

22 Claims, 11 Drawing Sheets

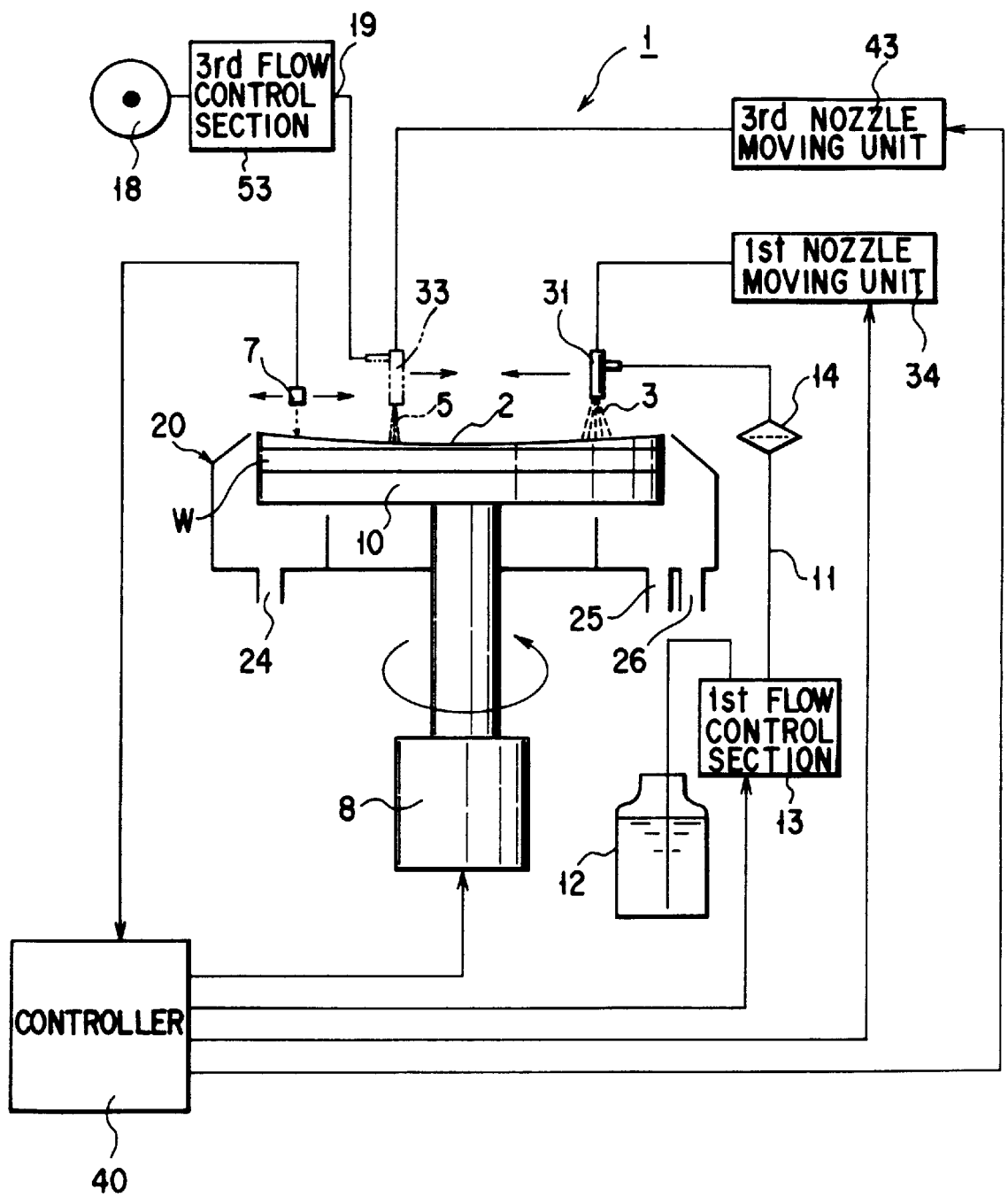
F I G. 1

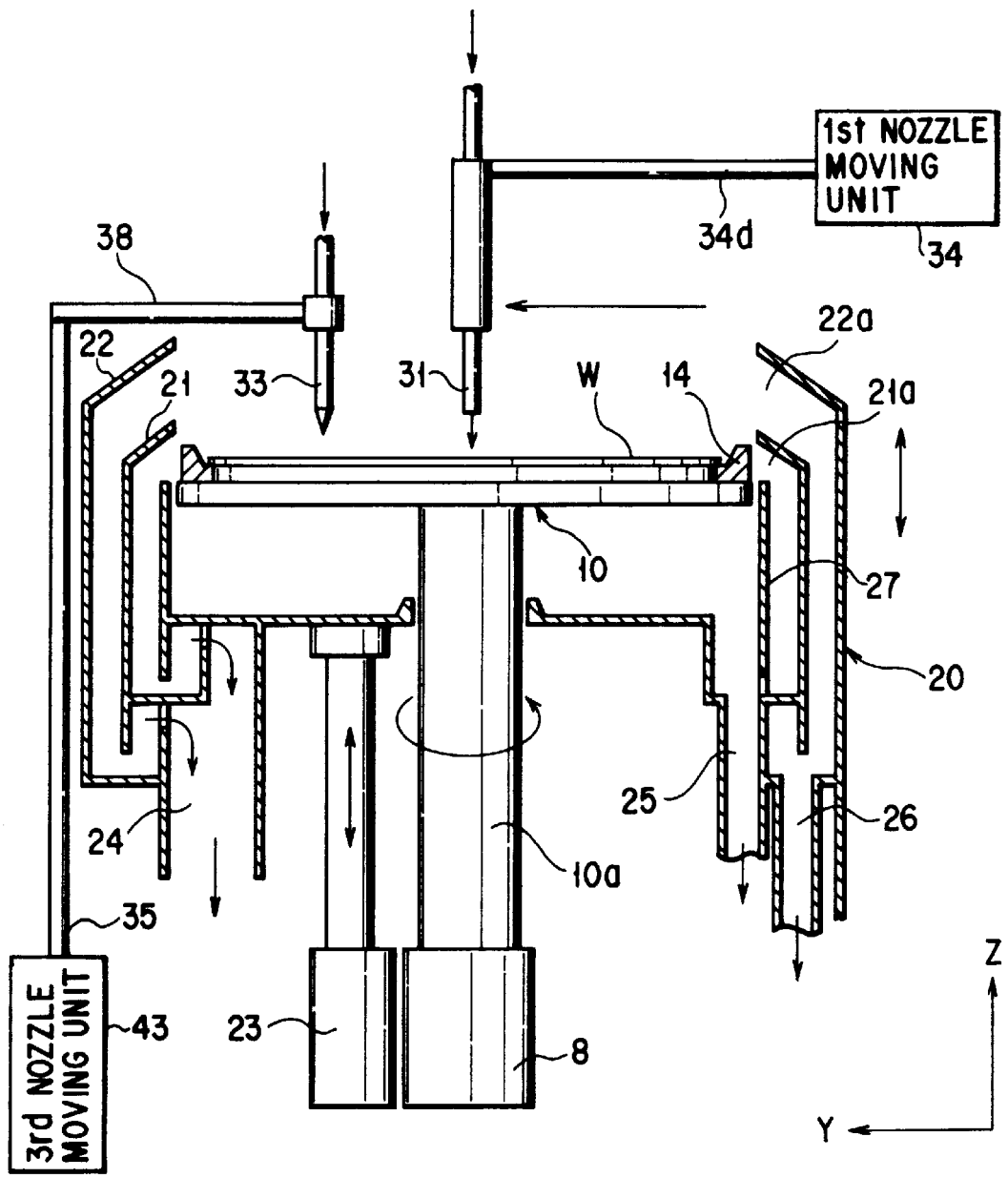
F I G. 2

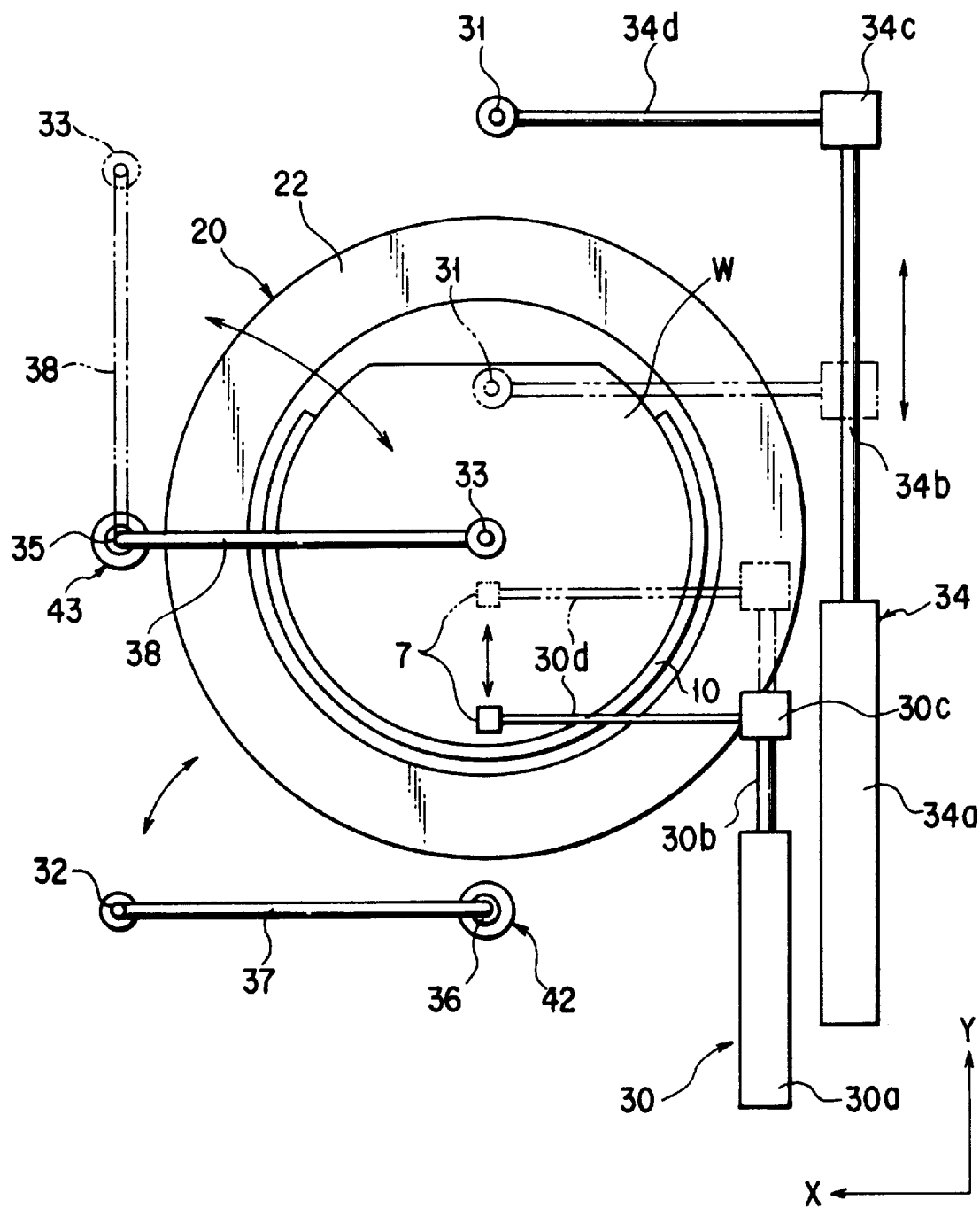
F I G. 3

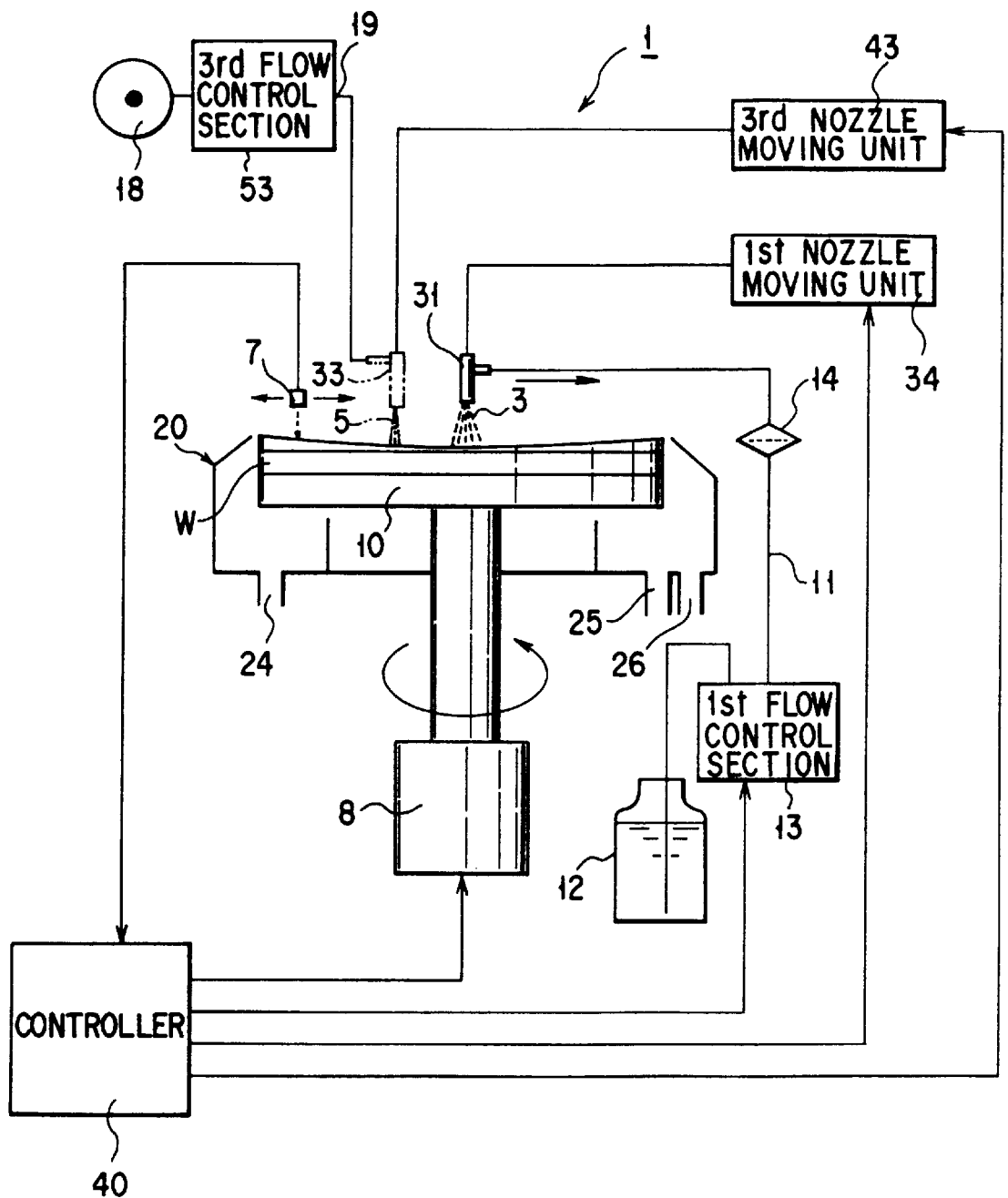
F I G. 10

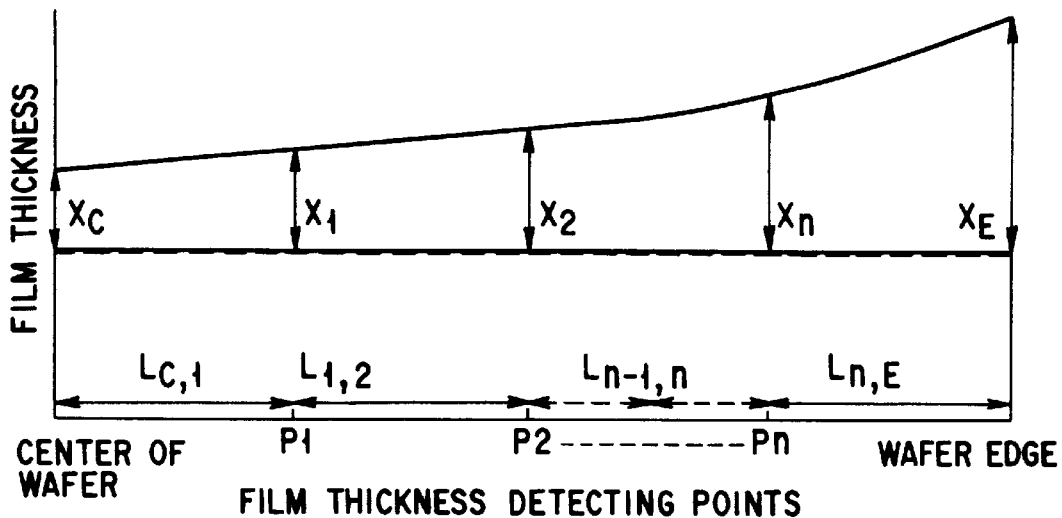
F I G. 11
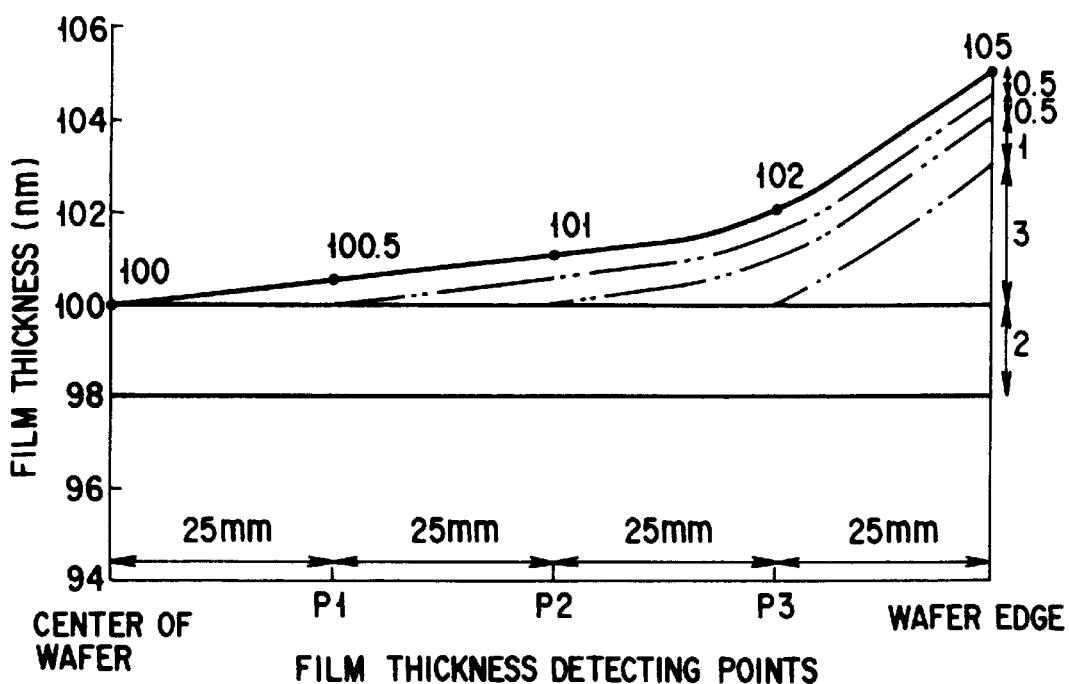
F I G. 12

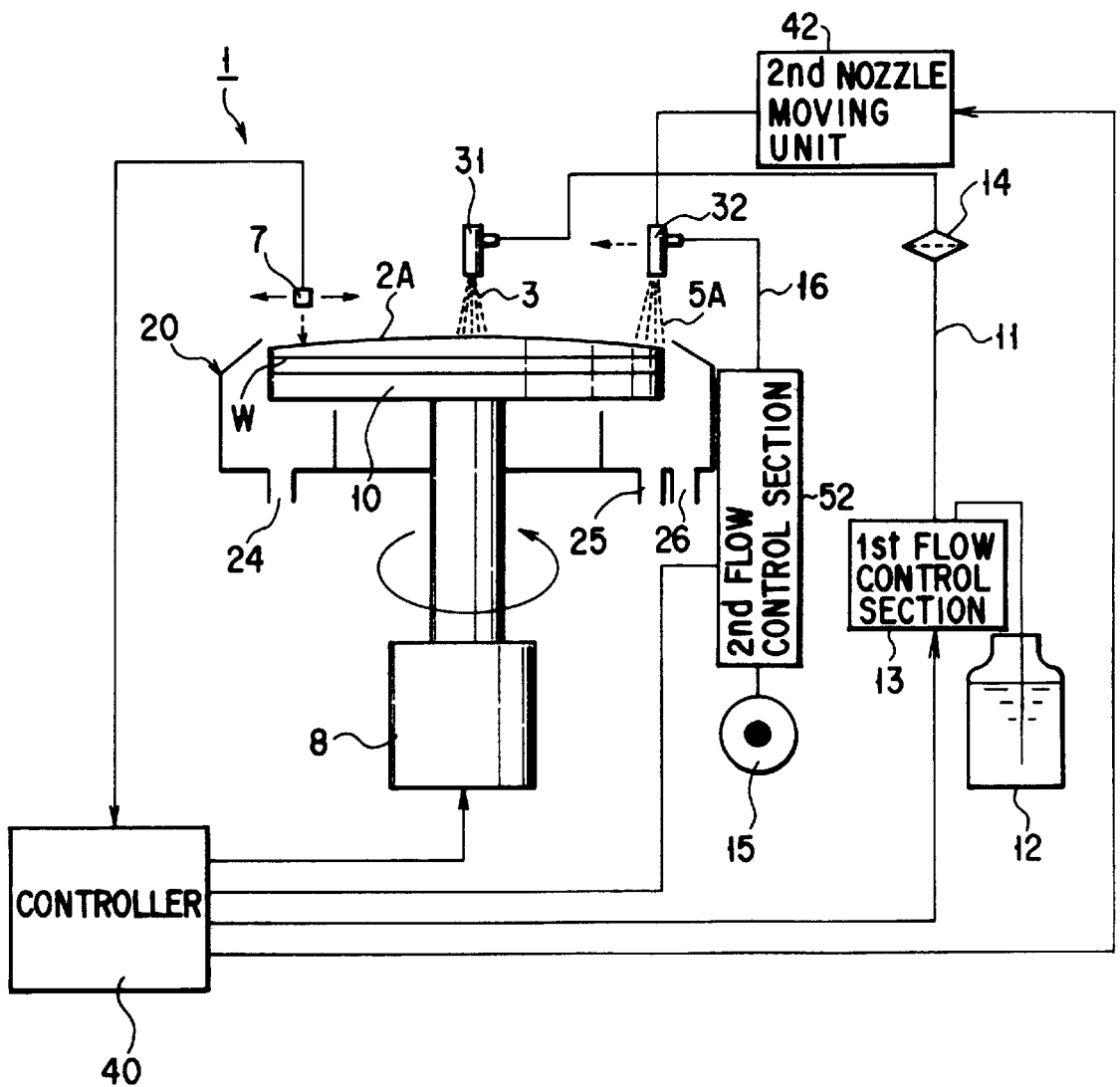
F I G. 13

METHOD FOR WET ETCHING OF THIN FILM

BACKGROUND OF THE INVENTION

The present invention relates to a method for wet etching of a thin film for flattening a thin film formed on a substrate such as a semiconductor wafer.

In the manufacture of a semiconductor device, a thin film of silicon oxide, silicon nitride, etc. is formed on a semiconductor wafer as an insulating film. A batch type chemical vapor deposition (CVD) method is widely employed for forming such a thin film.

In a silicon oxide film formed by a batch type CVD method, however, the thickness of the film tends to be larger in the peripheral portion of the wafer than in the central portion of the wafer. In the batch type CVD method, a process gas is supplied from a peripheral portion toward a central portion of the wafer. As a result, the process gas concentration is high in the peripheral portion. Also, the film-forming temperature is high in the vicinity of a heater. It follows that the silicon oxide film tends to be thickened in the peripheral portion of the wafer, as pointed out above.

If a silicon oxide film having a nonuniform thickness is etched for forming contact holes, the contact hole formed through a peripheral portion having a larger thickness tends to have a smaller diameter. On the contrary, the contact hole formed through a central portion having a smaller thickness tends to have a larger diameter. The nonuniformity in diameters of the contact holes gives rise to a low yield of the product semiconductor device.

A thin film formed by another film-forming method also tends to be nonuniform in thickness in some cases. For example, a thin film formed by a one-by-one type CVD method tends to be thicker in a central portion than in a peripheral portion of the wafer. The nonuniformity in the diameters of the contact holes formed through the film also takes place in this case, leading to a low yield of the product semiconductor device.

BRIEF SUMMARY OF THE INVENTION

An object of the present invention is to provide a method for wet etching of a thin film, which permits flattening a thin film formed on a substrate.

According to an aspect of the present invention, there is provided a method for wet etching of a thin film, in which a thin film formed on a substrate is etched with an etchant solution to flatten a surface of the thin film, comprising the steps of:

(a) setting in advance an etching rate of the thin film in view of a kind of the thin film to be etched, components of the etchant solution, and temperature;

(b) loading the substrate on a spin chuck such that the surface having the thin film formed thereon faces upward;

(c) detecting a thickness of the thin film in at least a peripheral portion and a central portion of the substrate;

(d) calculating moving speeds of a nozzle at predetermined passing points of the nozzle on the basis of the etching rate set in step (a) and a film thickness detected in step (c);

(e) rotating the substrate by driving the spin chuck; and (f) controlling the moving speed of the nozzle, while allowing the nozzle to supply the etchant solution to the thin film formed on the surface of the substrate which is being rotated, to conform with the moving speeds calculated in step (d) at the predetermined passing points of the nozzle so as to move the nozzle in a radial direction of the substrate.

According to another aspect of the present invention, there is provided a method for etching of a thin film, in which a thin film formed on a substrate is etched with an etchant solution to flatten a surface of the thin film, comprising the steps of:

(A) setting in advance an etching rate of the thin film in view of a kind of the thin film to be etched, components of the etchant solution, and temperature;

(B) loading the substrate on a spin chuck such that the surface having the thin film formed thereon faces upward;

(C) detecting a thickness of the thin film in at least a peripheral portion and a central portion of the substrate;

(D) calculating moving speeds of a second nozzle at predetermined passing points of the second nozzle on the basis of the etching rate set in step (A) and a film thickness detected in step (C);

(E) determining positions of the first nozzle and a second nozzle;

(F) rotating the substrate by driving the spin chuck;

(G) allowing the first nozzle to supply the etchant solution to a central portion of the thin film formed on the surface of the substrate which is being rotated; and (H) controlling the moving speed of the second nozzle, while allowing the second nozzle to supply a diluent, to conform with the moving speeds calculated in step (D) at the predetermined passing points of the nozzle so as to move the second nozzle in a radial direction of the substrate from a peripheral portion toward a central portion.

It is desirable to use a pure water as the diluent, though a solvent other than pure water may also be used as the diluent as far as the etchant solution can be dissolved in the solvent. The etchant solution used in the present invention is selected from a hydrofluoric acid solution a hydrofluoric acid-nitric acid mixed solution and a phosphoric acid solution. Alternatively, it is possible to use as the diluent an etchant solution having a concentration lower than that of the etchant solution used for etching the thin film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 1 is a block diagram schematically showing the construction of a wet etching apparatus;

FIG. 2 is a cross sectional view schematically showing the construction of a wet etching apparatus;

FIG. 3 is a plan view showing a wet etching apparatus;

FIG. 10 is a block diagram schematically showing a wet etching apparatus;

FIG. 11 schematically shows a profile of a thin film;

FIG. 12 schematically shows a profile of a thin film;

FIG. 13 is a block diagram schematically showing the construction of a wet etching apparatus.

DETAILED DESCRIPTION OF THE INVENTION

Figure 4:
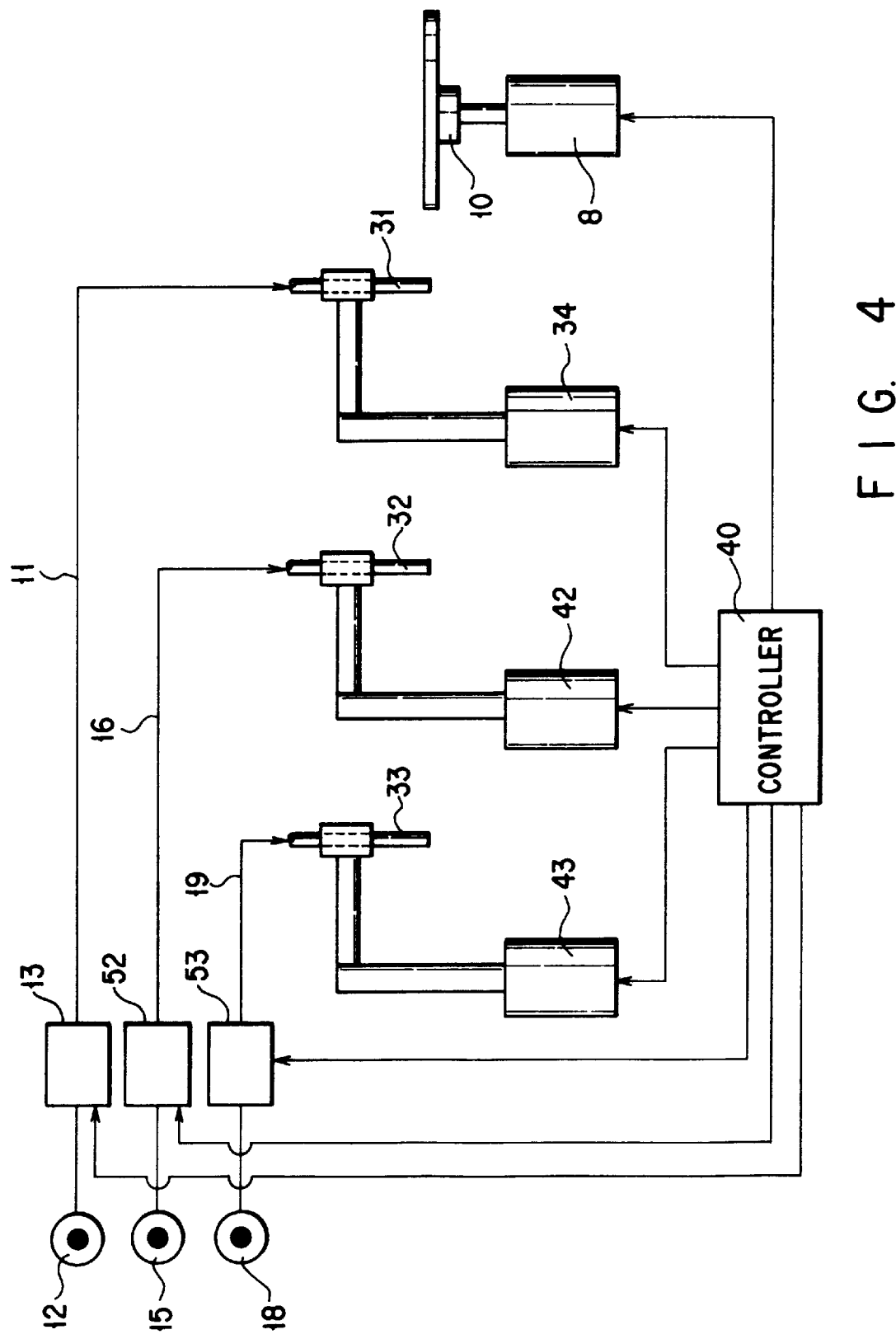
FIG. 4 is a block diagram showing a liquid supply circuit for a wet etching apparatus.

Let us describe some embodiments of the present invention with reference to the accompanying drawings. First of all, FIGS. 1 to 4 collectively show an etching apparatus 1 used for working a wet etching method according to a first embodiment of the present invention.

As shown in the drawings, the wet etching apparatus 1 comprises a spin chuck 10, a cup 20, first, second and third nozzles 31, 32, 33, first, second and third liquid supply sources 12, 15, 18, first, second and third flow rate control sections 13, 52, 53, first, second and third nozzle moving mechanisms 34, 41, 42, a film thickness sensor 7 and a controller 40.

Figure 6:
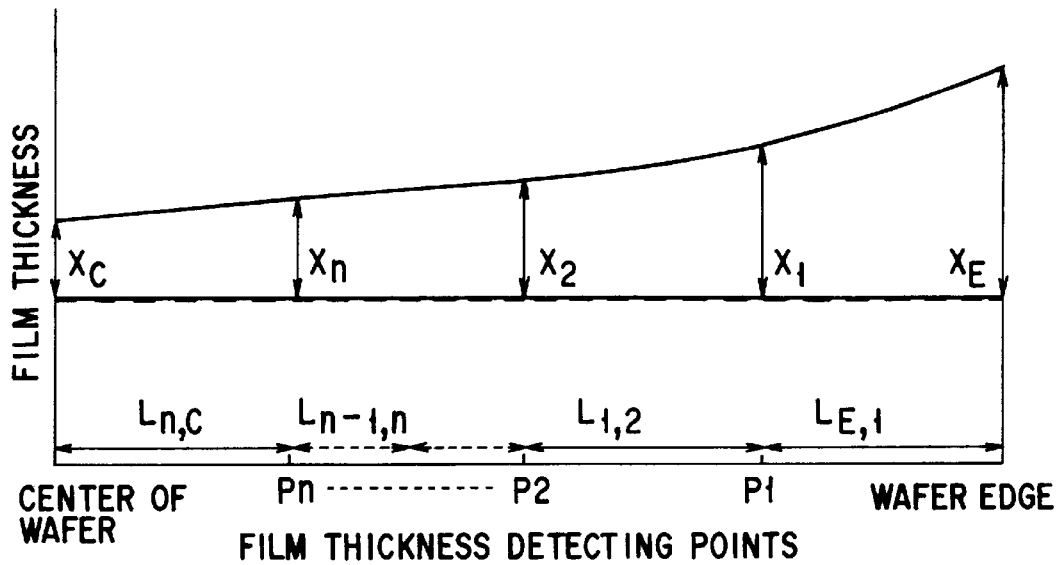
FIG. 6 schematically shows a profile of a thin film.
Figure 7:
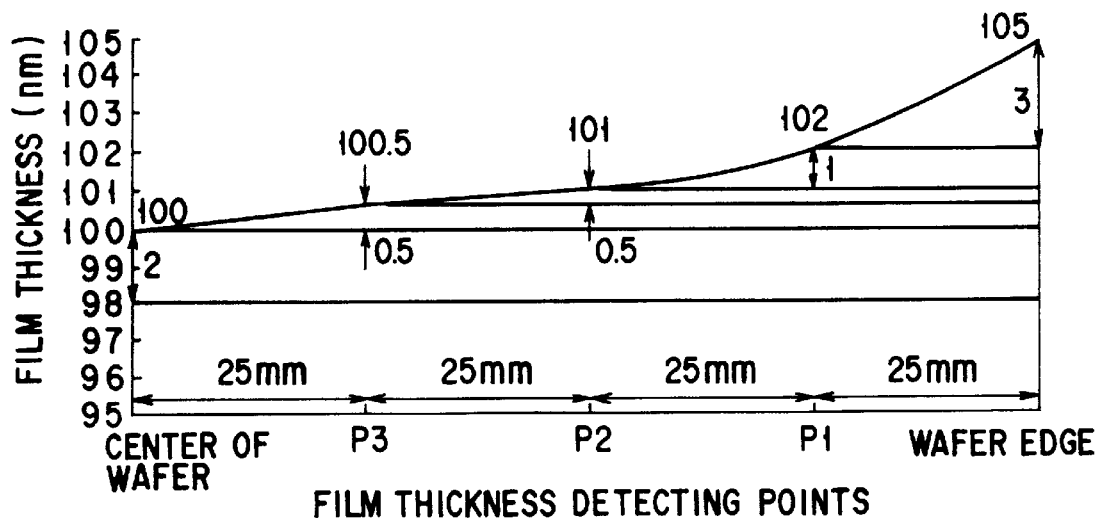
FIG. 7 schematically shows a profile of a thin film.

In the first embodiment of the present invention, a silicon oxide film 2 is formed by a batch type CVD method on one surface of a wafer W. The silicon oxide film 2 has an average thickness of about 100 nm. However, the film 2 is thicker in a peripheral portion than in a central portion of the wafer W as shown in FIGS. 6 and 7.

A mechanical chuck (not shown) permits the spin chuck 10 to hold the wafer W. A main shaft 10a of the spin chuck 10 is joined to a driving shaft of a motor 8 so as to allow the wafer W held by the spin chuck 10 to make a spin rotation about a Z-axis. A power source switch of the motor 8 is connected to an output side of the controller 40, with the result that the rotation speed of the motor 8 is controlled by the controller 40. Also, the spin chuck 10 is supported by a lift mechanism 23 so as to be movable in a direction of the Z-axis.

As shown in FIG. 2, the outer periphery and bottom portion of the spin chuck 10 are surrounded by the cup 20 comprising an inner cup 21 and an outer cup 22 concentric with the inner cup 21. The liquid such as the etchant solution, which is centrifugally separated from the wafer W, is received by these inner cup 21 and outer cup 22 and, then, discharged to the outside. An exhaust gas passageway 24 and drain pipes 25, 26 are formed in the bottom portions of the inner and outer cups 21, 22. The exhaust gas passageway 24 communicates with the suction port of an exhaust pump (not shown).

Further, a receiving cup 27 is formed inside the inner cup 21 in a manner to surround a lower region of the spin chuck 10. The liquid stored in the receiving cup 27 is discharged to the outside through the drain pipe 25. Also, the liquid entering the space between the inner cup 21 and the outer cup 22 is discharged to the outside through the drain cup 26.

As shown in FIG. 4, the first nozzle 31 communicates with the first liquid supply source 12 housing an etchant solution 3 through a line 11. The etchant solution 3 consists of a dilute hydrofluoric acid (DHF) solution prepared by diluting 1 part of a 50% hydrofluoric acid solution with 99 parts of water. The first flow rate control section 13 and the filter 14 are mounted to the line 11 extending from the first liquid supply source 12 to the first nozzle 31. The operating section of the first flow rate control section 13 is connected to the output side of the controller 40 so as to control the flow rate of the etchant solution 3 supplied to the first nozzle 31. Incidentally, it is desirable to use a diaphragm pump in the first flow rate control section 13.

The second nozzle 32 communicates with the second liquid supply source 15 housing a diluent 5A via a line 16. The diluent 5A consists of pure water. The second flow rate control section 52 is mounted to the line 16 extending from the second liquid supply source 15 to the second nozzle 32. The operating section of the second flow control section 52 is connected to the output side of the controller 40 so as to control the flow rate of the diluent 5A supplied to the second nozzle 32.

Further, the third nozzle 33 communicates with the third liquid supply source 18 housing a washing solution 5, which is pure water, via a line 19. Also, the flow rate control section 53 is mounted to the line 19 extending from the third liquid supply source 18 to the third nozzle 33. The operating section of the third flow rate control section 53 is connected to the output side of the controller 40 so as to control the flow rate of the washing solution 5 supplied to the third nozzle 33.

As shown in FIG. 3, the first nozzle 31 is mounted to the tip portion of an arm 34d of the first nozzle moving mechanism 34. The proximal end portion of the arm 34d is mounted to a rod 34b by a member 34c. Upon receipt of a command signal generated from the controller 40, the first nozzle moving mechanism 34 allows the rod 34b to be projected out of or retreated into a cylinder 34a. As a result, the first nozzle 31 is caused to make a linear motion above the wafer W in a radial direction of the wafer W along a Y-axis.

The second nozzle 32 is mounted to the tip portion of an arm 37 of the second nozzle moving mechanism 42. The proximal end portion of the arm 37 is mounted to the driving shaft of the motor 36. Upon receipt of a command signal generated from the controller 40, the motor 36 is driven to cause the arm 37 to be swung above the wafer W about a Z-axis. As a result, the second nozzle 32 is moved to depict a curved locus from a peripheral portion toward a central portion of the wafer W.

Further, the third nozzle 33 is mounted to the tip portion of an arm 38 of the third nozzle moving mechanism 43. The proximal end portion of the arm 38 is mounted to the driving shaft of a motor 35. Upon receipt of a command signal generated from the control section 40, the third nozzle moving mechanism 43 permits the motor 35 to be driven so as to cause the arm 38 to be swung above the wafer W about a Z-axis. As a result, the third nozzle 33 is moved to depict a curved locus from a peripheral portion toward a central portion of the wafer W.

The film thickness sensor 7 is mounted to the tip portion of an arm 30d of a nozzle moving mechanism 30. The proximal end portion of the arm 30d is mounted to a rod 30b by a member 30c. Upon receipt of a command signal generated from the controller 40, the nozzle moving mechanism 30 allows the rod 30b to be projected out of or retreated into a cylinder 30a. As a result, the film thickness sensor 7 is moved linearly along a Y-axis above the wafer W in a radial direction of the wafer W.

The film thickness sensor 7 is a non-contact type sensor which is arranged apart from the wafer W and permits detecting the thickness of the thin film 2. For example, it is possible to use an optical thickness detector or an ellipsometer as the film thickness sensor 7. In this embodiment, the thickness of the thin film 2 is detected on the spin chuck 20 by the sensor 7. Alternatively, it is possible to detect in advance the thickness of the thin film 2 at a point different from the spin chuck 20.

When a signal denoting the detected thickness of the film is supplied from the sensor 7 to the controller 40, the moving speed of the first nozzle 31 in a radial direction of the substrate is calculated in the controller 40 based on the signal supplied from the film thickness sensor 7 and a signal denoting the etching rate of the thin film experimentally determined in advance. Then, a command signal denoting the calculated moving speed of the first nozzle 31 in a radial direction is supplied to each of the motor 8, the first flow rate control section 13, the second nozzle moving mechanism 34, the second nozzle moving mechanism 42, and the third nozzle moving mechanism 43. As a result, the wafer W is rotated, and the first and second nozzles 31, 32 are moved in a radial direction of the substrate so as to control the discharge rate of the etching solution and the diluent from these nozzles 31, 32.

It should be noted that the thin film 2 is thicker in a peripheral portion than in a central portion, as already pointed out, making it important to control, particularly, the moving speed of the first nozzle 31 for supplying an etchant solution. In the present invention, the moving speed of the first nozzle 31 is controlled as follows.

Specifically, FIG. 6 shows a profile of the thin film 2 which is to be flattened by the wet etching method of the present invention. It is seen that the thickness of the thin film 2 is gradually decreased from the periphery of the wafer toward a central portion. For flattening the thin film 2, the excess thickness $X_1, X_2, \ldots X_n$ must be removed by etching at points $P_1, P_2, \ldots P_n$, respectively. Naturally, these marks $X_1, X_2, \ldots X_n$ also denote the etching amount. Where the wet etching is performed with a dilute hydrofluoric acid solution of a predetermined concentration at a predetermined temperature, the relationship between the etching time $(t_n)$ and the etching amount $(X_2)$ is represented by formula (1) given below:

$$X_n = k \cdot tn \quad (1)$$

where k is a coefficient of an etching rate. For example, where a thermal oxide film is etched with a dilute hydrofluoric acid solution (50% hydrofluoric acid solution: pure water=1:99) at 23° C. (room temperature), the coefficient k is 0.05 nm/sec.

Therefore, the etching time $t_n$ required for achieving the desired etching amount $X_n$ at point $P_n$ is given by:

$$t_n = X_n/k \quad (2-1)$$

It should be noted that the etchant solution of the hydrofluoric acid solution is present in the edge portion of the wafer W throughout the etching treatment. It follows that the total etching time is represented by tE.

In order to provide a differential etching amount $\Delta X_{E,1}$ between the wafer edge and point $P_1$, it is necessary to provide a differential time $(t_E-t_1)$. In other words, the differential etching amount $\Delta X_{E,1}$ can be achieved, if the first nozzle 31 takes time $(t_E-t_1)$ for the movement from the wafer edge to point $P_1$. It follows that the moving speed $V_{E,1}$ of the first nozzle 31 is given by formula (2-2) given below:

$$V_{E,1} = L_{E,1}/(t_E-t_1) \quad (2-2)$$

where $L_{E,1}$ denotes the distance between the wafer edge and point $P_1$.

Formula (3) given below can be obtained by substituting formula (1) in formula (2-2):

$$V_{E,1} = k/L_{E,1}/\Delta X_{E,1} \quad (3)$$

It follows that the moving speed $V_{n-1,n}$ of the first nozzle 31 between adjacent points is given by formula (4) given below:

$$V_{n-1,n} = k \cdot L_{n-1,n}/\Delta X_{E,1} \quad (4)$$

Incidentally, the controllability of the etching rate is improved with increase in the number of moving speed changing points.

Let us describe more in detail the moving speed of the first nozzle 31 with reference to FIG. 7. Suppose a CVD oxide film 2 having a profile as shown in FIG. 7 is etched at 23.0° C. with a dilute hydrofluoric acid solution (50% hydrofluoric acid solution: pure water=1:99) to make the oxide film 2 uniform in thickness (98 nm). In this case, the etching rate k is set at 0.4 nm/sec. Under this condition, the moving speed and time required for the movement of the first nozzle 31 between adjacent points can be determined by formula (4) as follows. Incidentally, the wafer W is sized at 8 inches in diameter.

| | Time required for movement |
|---|---|
| $V_{E,1} = 4 \times 25/30 = 3.35$ mm/sec | 7.5 sec. |
| $V_{1,2} = 4 \times 25/10 = 10$ mm/sec | 2.5 sec. |
| $V_{2,3} = 4 \times 25/5 = 20$ mm/sec | 1.25 sec. |
| $V_{3,C} = 4 \times 25/5 = 20$ mm/sec | 1.25 sec. |

Further, the nozzle 31 is held stationary for 5 seconds at a point right above the center of the wafer to allow the hydrofluoric acid solution to be spread over the entire region of the thermal oxide film 2. As a result, the entire region of the film 2 is uniformly etched to decrease the thickness of the film 2 by 2 nm.

As exemplified above, the total etching time including the time required for the movement of the nozzle and the stationary time (5 seconds) of the nozzle is 17.5 seconds.

Figure 5:
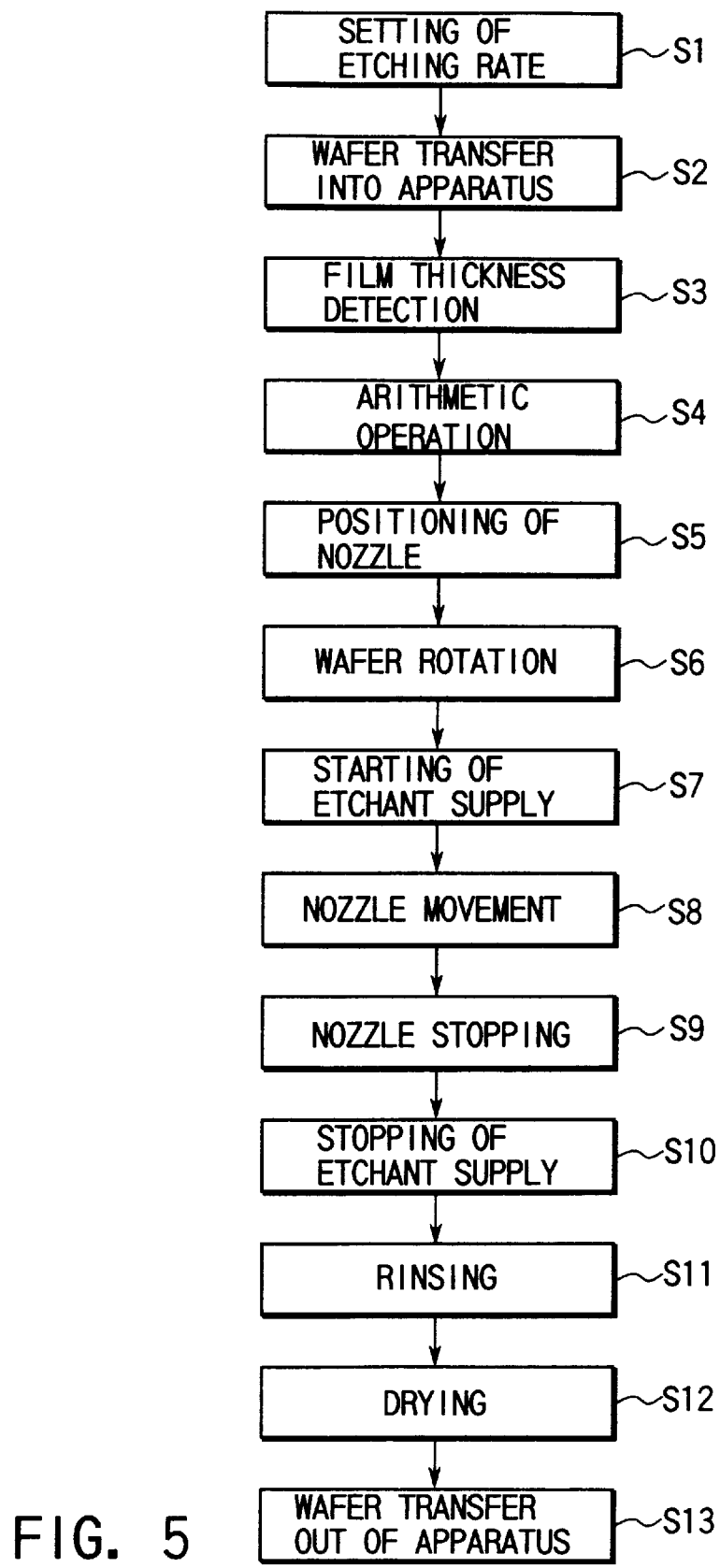
FIG. 5 is a flow chart showing a method for wet etching of a thin film according to a first and a second embodiments of the present invention.

FIG. 5 shows how to flatten the thin film 2 whose thickness is gradually decreased from a periphery toward a central portion of the wafer W. Specifically, the etching rate of the thin film 2, which is determined by the kind of the thin film, components of the etchant solution, and temperature, is set in advance (step S1). The etching rate thus set is stored in a memory portion of the controller 40.

Then, the wafer W is disposed on the spin chuck 10 such that the thin film 2 formed thereon faces upward (step S2). Under this condition, the film thickness sensor 7 is scanned to detect the thickness of the thin film 2 in at least the peripheral portion and the central portion of the wafer W, and a signal denoting the detected thickness is supplied to the controller 40 (step S3). Alternatively, it is possible to detect in advance the thickness of the thin film 2 before the step S2 by an apparatus differing from the wet etching apparatus 1, and supply a signal denoting the detected thickness to the controller 40.

In the next step (step S4), the moving speed of the first nozzle 31 for each passing point is determined by an arithmetic operation on the basis of the etching rate of the thin film set in step S1 and the film thickness detected in step S3. Then, the first nozzle 31 is positioned above a peripheral portion of the wafer W (step S5), followed by supplying a command signal from the controller 40 to the spin chuck 10 so as to rotate the wafer W at a rotating speed of about 300 rpm (step S6).

During rotation of the wafer W, the first nozzle 31 begins to supply the etchant solution 3 toward the thin film 2 (step S7). Also, the controller 40 supplies a command signal to the first nozzle moving mechanism 34 so as to control the moving speed of the first nozzle 31. In this step, the first nozzle 31 is moved in a radial direction from the peripheral portion toward the central portion of the wafer W while controlling the moving speed of the first nozzle 31 to conform with the moving speed for each passing point which is obtained in step S4 (step S8). The thin film 2 is etched with the etchant solution 3 supplied from the first nozzle 31 during its scanning movement so as to flatten the surface of the thin film 2. The first nozzle 31 is further moved and, then, held stationary while supplying the etchant solution 3 for 5 seconds above the central portion of the wafer W so as to etch the entire region of the thin film 2 (step S9).

After the etching of the entire region of the thin film 2, the first nozzle 31 is allowed to cease to supply the etchant solution 3 and retreated (step S10).

Under this condition, a washing solution (pure water) 5 is supplied from the third nozzle 33 to the wafer W while moving the third nozzle 33 from a peripheral portion toward a central portion of the wafer W so as to wash away the residual etchant solution 3 from the thin film 2 (step S11). Alternatively, the rinsing step S11 may be started during retreat of the first nozzle 31.

Figure 8:
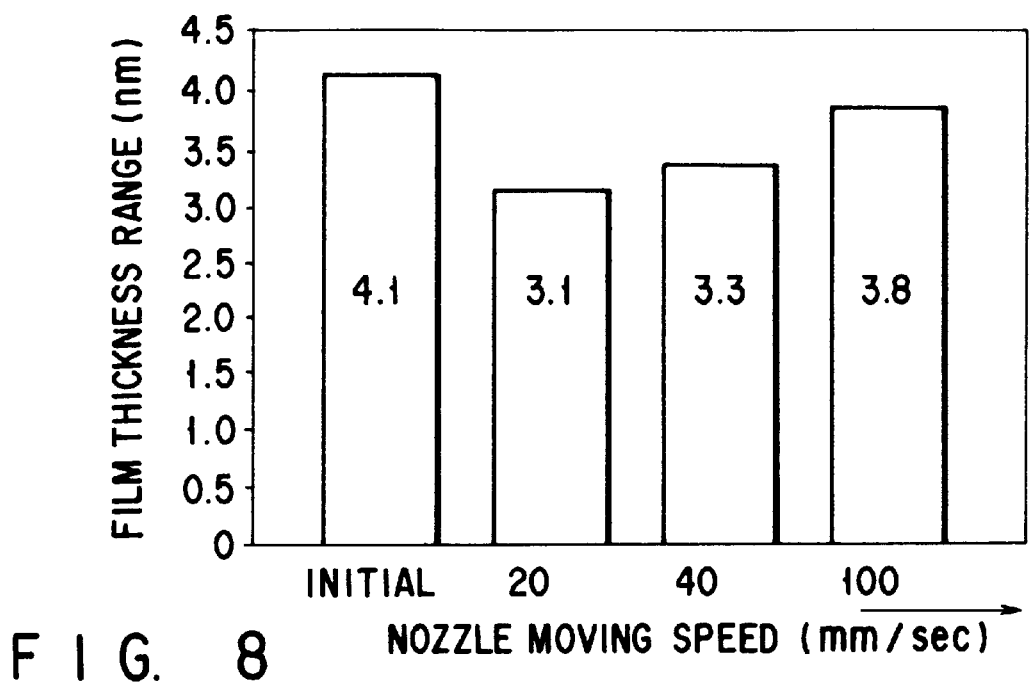
FIG. 8 is a graph showing how a difference in thickness of a thin film is affected by a nozzle moving speed.

FIG. 8 is a graph showing the relationship between the nozzle moving speed, which is plotted on the abscissa, and the film thickness range, which is plotted on the ordinate. For obtaining the experimental data, the rotating speed of the wafer W was set constant at 300 rpm when the film thickness range, which is a difference between the maximum thickness and the minimum thickness of the thin film 2 and, thus, denotes a degree of nonuniformity in thickness of the thin film 2, was 4.1 nm in the initial stage of the etching treatment. Under this condition, the moving speed of the first nozzle 31 was changed to 20 mm/sec, 40 mm/sec and 100 mm/sec. As apparent from FIG. 8, the film thickness range was found to be 3.1 nm when the nozzle moving speed was set at 20 mm/sec, indicating that the etching amount was rendered optimum. Further, the film thickness ranges were found to be 3.3 nm and 3.8 nm when the nozzle moving speeds were set at 40 mm/sec and 100 mm/sec, respectively.

Figure 9:
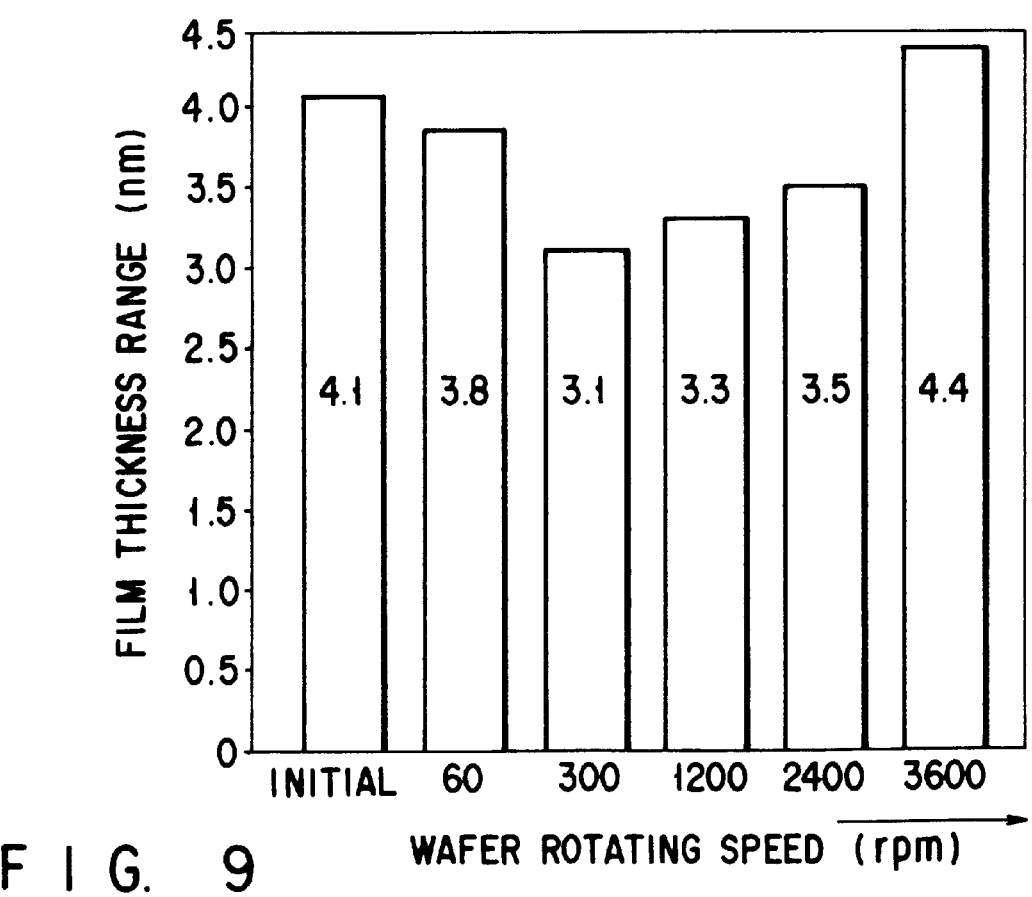
FIG. 9 is a graph showing how a difference in thickness of a thin film is affected by a rotating speed of a wafer.

FIG. 9 is a graph showing the relationship between the wafer rotating speed (rpm), which is plotted on the abscissa, and the film thickness range, which is plotted on the ordinate. In this case, the moving speed of the first nozzle 31 was set constant at 20 mm/sec when the film thickness range of the thin film 2 was 4.1 nm in the initial stage of the etching treatment. Under this condition, the rotating speed of the wafer W was changed to 60 rpm, 300 rpm, 1200 rpm, 2400 rpm, and 3600 rpm. As apparent from FIG. 8, the film thickness range was found to be 3.1 nm, which was the smallest value, when the rotating speed of the wafer was set at 300 rpm, supporting that it is desirable to set the rotating speed of the wafer W at about 300 rpm. Also, the film thickness ranges were found to be 3.8 nm, 3.3 nm, 3.5 nm and 4.4 nm when the rotating speeds of the wafer were set at 60 rpm, 1200 rpm, 2400 rpm and 3600 rpm, respectively.

FIGS. 8 and 9 collectively show that, where the nonuniformity in thickness of the thin film 2 is 1 nm, the surface of the thin film 2 can be flattened by setting the rotating speed of the wafer W at 300 rpm and by setting the moving speed of the first nozzle 31 at 20 mm/sec.

Let us describe a wet etching method of a thin film according to a second embodiment of the present invention with reference to FIGS. 10 to 12 and FIG. 5. In the following description of the second embodiment, an overlapping portion with the first embodiment is omitted.

The second embodiment is equal to the first embodiment in steps S1 to S4. In the second embodiment, the first nozzle 31 is positioned above the central portion of the wafer W (step S5). Then, a command signal is supplied from the controller 40 to the spin chuck 10 to rotate the wafer W at a speed of about 300 rpm (step S6).

During rotation of the wafer W, the first nozzle 31 begins to supply the etchant solution 3 toward the thin film 2 (step S7). Then, the controller 40 supplies a command signal to the moving mechanism 34 so as to control the moving speed of the first nozzle 31. In this step, the first nozzle 31 is moved in a radial direction from the central portion toward the peripheral portion of the wafer W while controlling the moving speed of the first nozzle 31 to conform with the moving speed for each passing point which is obtained in step S4 (step D8).

It should be noted that the thin film 2 is thinner in a central portion than in a peripheral portion of the wafer W, making it particularly important to control the moving speed of the etchant solution supply nozzle (first nozzle) 31. Therefore, the moving speed of the etchant solution supply nozzle 31 is controlled as follows.

Specifically, FIG. 11 shows that the thickness of the thin film 2 before the etching treatment is moderately decreased from a peripheral portion toward a central portion of the wafer W. In order to make the thin film 2 uniform in thickness by the etching treatment, it is necessary to remove a surface region of the thin film 2 in thicknesses $X_1$ to $X_n$ for points $P_1$ to $P_n$, respectively. Naturally, the relationship between the etching amount ($X_n$) and the etching time ($t_n$) is represented by formula (5) given below, where the etching is performed with a dilute hydrofluoric acid solution of a predetermined concentration under a predetermined temperature:

$$X_n = k \cdot tn \tag{5}$$

where k denotes an etching rate. Where, for example, a thermal oxide film is etched with a dilute hydrofluoric acid solution (50% hydrofluoric acid solution: pure water=1:99) at room temperature (23° C.), the etching rate k is 0.05 nm/sec.

It follows that the time $t_n$ required for achieving the etching amount $X_n$ at point $P_n$ is determined by formula (6-1) given below:

$$t_n = X_n/k \tag{6-1}$$

It should be noted that the etchant solution of the hydrofluoric acid solution is present in the edge portion of the wafer W throughout the etching treatment. It follows that the total etching time is represented by $t_E$.

In order to provide a differential etching amount $\Delta X_{C,1}$ between the center of the wafer W and point P1, it is necessary to provide a differential time ($t_C-t_1$). In other words, the differential etching amount $\Delta X_{C,1}$ can be achieved, if the first nozzle 31 takes time ($t_{C-t1}$) for the movement from the center of the wafer W to point $P_1$. It follows that the moving speed $V_{C,1}$ of the first nozzle 31 is given by formula (6-2) given blow:

$$V_{C,1}=L_{C,1}/(t_C-t_1) \qquad (6-2)$$

where $L_{C,1}$ denotes the distance between the center of the wafer and point $P_1$.

Formula (7) given below can be obtained by substituting formula (5) in formula (6-2):

$$V_{C,1}=k/L_{C,1}/\Delta X_{C,1} \qquad (7)$$

It follows that the moving speed $V_{n-1,n}$ of the first nozzle 31 between adjacent points is given by formula (8) given below:

$$V_{n-1,n}=k \times L_{n-1,n}/\Delta X_{C,1} \qquad (8)$$

Incidentally, the controllability of the etching rate is improved with increase in the number of moving speed changing points.

Let us describe more in detail the moving speed of the first nozzle 31 with reference to FIG. 12. Suppose a CVD oxide film 2 having a profile as shown in FIG. 12 is etched at 23° C. with a dilute hydrofluoric acid solution (50% hydrofluoric acid solution: pure water=1:99) to make the oxide film 2 uniform in thickness (98 nm). In this case, the etching rate k is set at 0.4 nm/sec. Under this condition, the moving speed and time required for the movement of the first nozzle 31 between adjacent points can be determined by formula (8) as follows. Incidentally, the wafer W is sized at 8 inches in diameter.

|  | Time required for movement |
|---|---|
| $V_{C,1}$ = 4 × 25/5 = 20 mm/sec | 1.25 sec. |
| $V_{1,2}$ = 4 × 25/5 = 20 mm/sec | 1.25 sec. |
| $V_{2,3}$ = 4 × 25/10 = 10 mm/sec | 2.5 sec. |
| $V_{3,E}$ = 4 × 25/30 = 3.35 mm/sec | 7.5 sec. |

When the first nozzle 31 is moved to reach a point above the periphery of the wafer W, the first nozzle 31 ceases to discharge the etchant solution and is brought back to a point above the center of the wafer W. Then, the first nozzle 31 is held stationary at a point right above the center of the wafer W (step S9) and allowed to spray the etchant solution for 5 seconds to etch uniformly the entire region of the oxide film 2 by 2 nm (step S10).

As exemplified above, the total etching time including the time required for the movement of the nozzle and the stationary time (5 seconds) of the nozzle is 17.5 seconds.

Subsequent steps (steps S11 to S13) are equal to those in the first embodiment.

Figure 14:
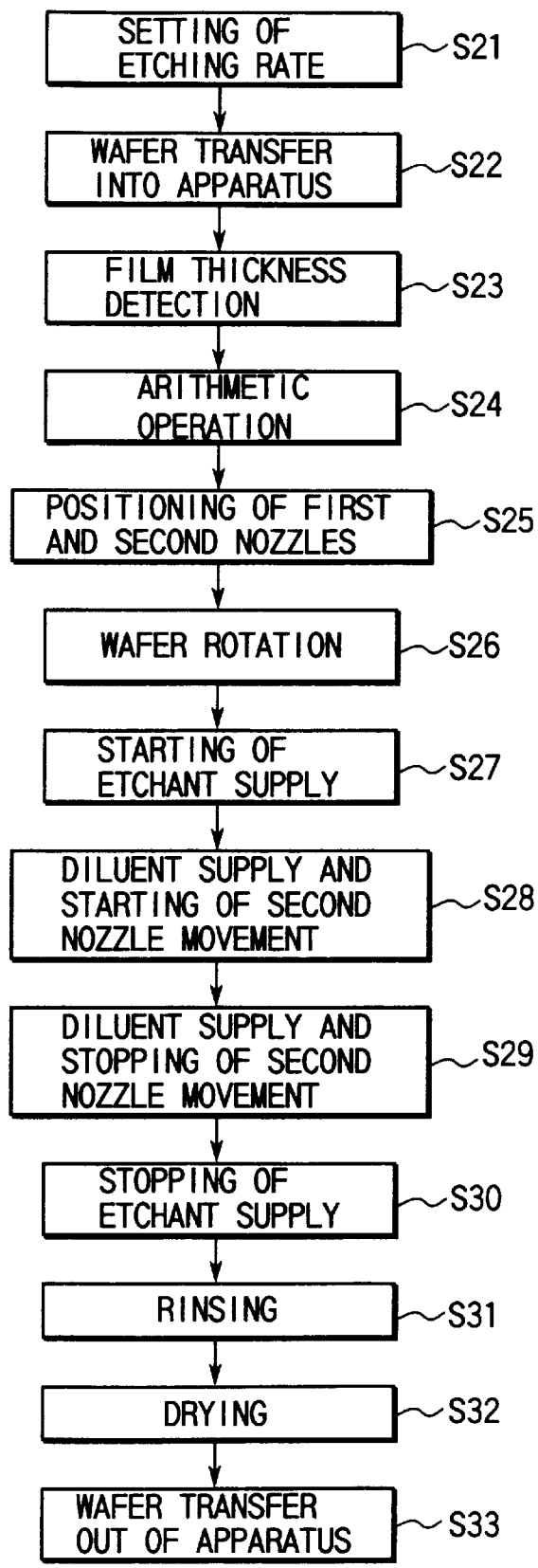
FIG. 14 is a flow chart showing a method for wet etching of a thin film according to a third embodiment of the present invention.

FIGS. 13 and 14 collectively show a method for wet etching of a thin film according to a third embodiment of the present invention. The overlapping portion with the above mentioned embodiment is omitted in the following description of the other embodiment.

A thin film 2A formed on the wafer W is flattened in the third embodiment, said thin film 2A consisting of a silicon nitride film formed by a one-by-one type CVD film-forming method. The thickness of the thin film 2A is gradually decreased from a central portion toward a peripheral portion of the wafer W. Also, the etchant solution 3, which is a 0.5% dilute hydrofluoric acid solution, is supplied from the first nozzle 31 toward the thin film 2A. Further, a diluent 5A, which consists of pure water, is supplied from the second nozzle 32 toward the thin film 2A.

FIG. 14 shows how to flatten the thin film 2A whose thickness is gradually decreased from a central toward a peripheral portion of the wafer W. Specifically, the etching rate of the thin film 2A, which is determined by the kind of the thin film, components of the etchant solution, and temperature, is set in advance (step S21). The etching rate thus set is stored in a memory portion of the controller 40.

Then, the wafer W is disposed on the spin chuck 10 such that the thin film 2A formed thereon faces upward (step S22). Under this condition, the film thickness sensor 7 is scanned to detect the thickness of the thin film 2A in at least the peripheral portion and the central portion of the wafer W, and a signal denoting the detected thickness is supplied to the controller 40 (step S23). Alternatively, it is possible to detect in advance the thickness of the thin film 2A before the step S22 by an apparatus differing from the wet etching apparatus 1, and supply a signal denoting the detected thickness to the controller 40.

In the next step (step S24), the moving speed of the second nozzle 32 for each passing point is determined by an arithmetic operation on the basis of the etching rate of the thin film set in step S21 and the film thickness detected in step S23. Then, the first and second nozzles 31 and 32 are positioned above a central portion and a peripheral portion, respectively, of the wafer W (step S25), followed by supplying a command signal from the controller 40 to the spin chuck 10 so as to rotate the wafer W at a rotating speed of about 300 rpm (step S26).

During rotation of the wafer W, the first nozzle 31 begins to supply the etchant solution 3 toward the thin film 2A (step S27). At the same time, the second nozzle 32, which begins to be moved in a radial direction of the substrate, begins to supply the diluent 5A toward the thin film 2A during rotation of the wafer W (step S28). Also, the controller 40 supplies a command signal to the second nozzle moving mechanism 42 so as to control the moving speed of the second nozzle 32. In this step, the second nozzle 32 is moved in a radial direction from the peripheral portion toward the central portion of the wafer W while controlling the moving speed of the second nozzle 32 to conform with the moving speed for each passing point which is obtained in step S24. The thin film 2A is etched with the etchant solution 3 which continues to be supplied in a predetermined supply rate from the first nozzle 31 during the scanning movement of the second nozzle 32 so as to flatten the surface of the thin film 2A. It should be noted that the etchant solution 3 begins to be mixed with the diluent 5A from the peripheral portion of the wafer W so as to be diluted. Naturally, the etchant concentration is made lower in the peripheral portion than in a central portion of the wafer W, with the result that the etching rate is made lower in the peripheral portion than in the central portion. It follows that the etching amount is greater in the central portion than in the peripheral portion so as to flatten the thin film 2A which was thicker in the central portion than in the peripheral portion.

Then, the second nozzle 32 is held stationary above the central portion of the wafer W and ceases to supply the diluent 5A (step S29). At the same time, the first nozzle 31 is allowed to continue to supply the etchant solution 3 for 5 minutes so as to etch the entire region of the thin film 2A.

After the etching of the entire region of the thin film 2A, the first nozzle 31 is allowed to cease to supply the etchant solution 3 and retreated (step S30). Under this condition, a washing solution (pure water) 5 is supplied from the third nozzle 33 to the wafer W while moving the third nozzle 33 from a peripheral portion toward a central portion of the wafer W so as to wash away the residual etchant solution 3 from the thin film 2A (step S31). Alternatively, the rinsing step S31 may be started during retreat of the first nozzle 31.

In the embodiment described above, pure water is used as the diluent 5A. Alternatively, an etchant solution of a concentration lower than that of the etchant solution 3 supplied to a central portion of the wafer can be used as the diluent 5A.

As described above, the thickness of a thin film is detected at a plurality of points in the wet etching method of the present invention. Since the moving speed of the nozzle in a radial direction of the substrate for supplying an etchant solution is changed on the basis of the film thickness detected at plural points, the etching amount can be controlled to conform with the thickness at each point of the thin film. As a result, a thin film which is thicker in a peripheral portion than in a central portion can be flattened satisfactorily.

It should also be noted that the moving speed of a nozzle in a radial direction of the substrate for supplying a diluent is controlled on the basis of the film thickness detected at a plurality of points, making it possible to control the etching amount to conform with the thickness at each point of the thin film. As a result, a thin film which is thicker in a central portion than in a peripheral portion can also be flattened satisfactorily.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for wet etching of a thin film, in which a thin film formed on a substrate is etched with an etchant solution to flatten a surface of the thin film nonuniform in thickness, comprising the steps of:
    (a) setting in advance an etching rate of said thin film in view of a kind of the thin film to be etched, components of said etchant solution, and temperature;
    (b) loading the substrate on a spin chuck such that the surface having said thin film formed thereon faces upward;
    (c) detecting a thickness of the thin film in at least a peripheral portion and a central portion of the substrate;
    (d) calculating moving speeds of a nozzle at plural passing points of said nozzle on the basis of said etching rate set in said step (a) and a film thickness detected in said step (c);
    (e) rotating the substrate by driving said spin chuck; and
    (f) controlling the moving speed of the nozzle, while allowing the nozzle to supply the etchant solution to the thin film formed on the surface of the substrate which is being rotated, to conform with the moving speeds calculated in said step (d) at each of the plural passing points of the nozzle so as to move the nozzle in a radial direction of the substrate.

2. The method according to claim 1, wherein the moving speed of said nozzle is changed in said step (f) every time the nozzle passes through each of said plural passing points.

3. The method according to claim 1, wherein said nozzle is moved linearly from the peripheral portion toward the central portion of the substrate in said step (f).

4. The method according to claim 1, wherein said nozzle is moved to depict a curved locus from the peripheral portion toward the central portion of the substrate in said step (f).

5. The method according to claim 1, wherein said nozzle is moved linearly from the central portion toward the peripheral portion of the substrate in said step (f).

6. The method according to claim 1, wherein said nozzle is moved to depict a curved locus from the central portion toward the peripheral portion of the substrate in said step (f).

7. The method according to claim 1, wherein the rotating speed of the substrate is set constant in said step (e), and the etchant solution supply rate from said nozzle to the substrate is set constant in said step (f).

8. The method according to claim 1, wherein the thickness detecting step (c) is performed before the substrate loading step (b).

9. The method according to claim 1, wherein said etchant solution is further supplied after said step (f) to the central portion of the rotating substrate for a constant period of time for etching the entire region of the thin film.

10. The method according to claim 1, wherein said etchant solution is selected from the group consisting of a hydrofluoric acid solution, a hydrofluoric acid-nitric acid mixed solution and a phosphoric acid solution.

11. The method according to claim 1, wherein said thin film is a silicon oxide or silicon nitride film formed by a batch type chemical vapor deposition.

12. The method according to claim 1, wherein said thin film is a silicon oxide or silicon nitride film formed by a one-by-one type chemical vapor deposition.

13. A method for wet etching of a thin film, in which a thin film formed on a substrate is etched with an etchant solution to flatten a surface of the thin film nonuniform in thickness, comprising the steps of:
    (A) setting in advance an etching rate of said thin film in view of a kind of the thin film to be etched, components of said etchant solution, and temperature;
    (B) loading the substrate on a spin chuck such that the surface having said thin film formed thereon faces upward;
    (C) detecting a thickness of the thin film in at least a peripheral portion and a central portion of the substrate;
    (D) calculating moving speeds of a second nozzle at plural passing points of said second nozzle on the basis of said etching rate set in step (A) and a film thickness detected in step (C);
    (E) determining positions of a first nozzle and said second nozzle;
    (F) rotating the substrate by driving said spin chuck;
    (G) allowing the first nozzle to supply the etchant solution to a central portion of the thin film formed on the surface of the substrate which is being rotated; and
    (H) controlling the moving speed of the second nozzle, while allowing the second nozzle to supply a diluent, to conform with the moving speeds calculated in step (D) at each of the plural passing points of the nozzle so as to move the second nozzle in a radial direction of the substrate from a peripheral portion toward a central portion of the substrate.

14. The method according to claim 13, wherein the supply rate of at least one of said etchant solution and the diluent is controlled in each of said steps (G) and (H) on the basis of the film thickness detected in said (C).

15. The method according to claim 13, wherein the moving speed of said second nozzle is changed in said step (F) every time the nozzle passes through each of said plural passing points.

16. The method according to claim 13, wherein the rotating speed of the substrate is set constant in said step (F), and the etchant solution supply rate from said first to the substrate is set constant in said step (H).

17. The method according to claim 13, wherein the thickness detecting step (C) is performed before the substrate loading step (B).

18. The method according to claim 13, wherein said etchant solution is further supplied after said step (H) to the central portion of the rotating substrate for a constant period of time for etching the entire region of the thin film.

19. The method according to claim 13, wherein said first nozzle is positioned above the central portion of the substrate in said step (E).

20. The method according to claim 13, wherein said thin film is a silicon oxide or silicon nitride film formed by a batch type chemical vapor deposition.

21. The method according to claim 13, wherein said thin film is a silicon oxide or silicon nitride film formed by a one-by-one type chemical vapor deposition.

22. The method according to claim 13, wherein said diluent is pure water.

* * * * *